United States Patent

[11] 3,615,874

[72] Inventors Martin P. Lepselter
New Providence, N.J.;
Herbert A. Waggener, Allentown, Pa.
[21] Appl. No. 857,936
[22] Filed Sept. 15, 1969
[45] Patented Oct. 26, 1971
[73] Assignee Bell Telephone Laboratories, Incorporated
Murray Hill, N.J.

[54] METHOD FOR PRODUCING PASSIVATED PN JUNCTIONS BY ION BEAM IMPLANTATION

7 Claims, 6 Drawing Figs.

[52] U.S. Cl. .......... 148/1.5, 29/576, 148/186, 148/187
[51] Int. Cl. .......... H01l 7/54
[50] Field of Search .......... 148/1.5, 186, 187; 29/576

[56] References Cited

UNITED STATES PATENTS

| | | | |
|---|---|---|---|
| 3,388,009 | 6/1968 | King .......... | 148/1.5 |
| 3,534,235 | 10/1970 | Bower et al. .......... | 148/187 |

*Primary Examiner*—L. Dewayne Rutledge
*Assistant Examiner*—R. A. Lester
*Attorneys*—R. J. Guenther and Arthur J. Torsiglieri

ABSTRACT: A method for producing tucked-under, passivated PN junctions in semiconductor devices by ion implantation through a layered mask. The mask comprises a first relatively thin dielectric layer and a conductive layer thereover. An aperture is formed in the conductive layer, and the structure is subjected to a beam of dopant ions having energy sufficient to penetrate the dielectric layer but insufficient to penetrate the combined layers. In this fashion a PN junction is formed in the semiconductor body underneath the aperture in the conductive layer. Then the conductive layer is caused to become thicker, e.g., by electroplating, which also causes the aperture in the second layer to become smaller in lateral dimension. Then, using the conductive layer as a mask, the portion of the dielectric layer exposed through the aperture is selectively removed, e.g., by backsputtering. In this manner there is exposed a portion of the surface which is smaller than the implanted zone.

INVENTORS M. P. LEPSELTER
H. A. WAGGENER
BY Arthur J. Torsiglieri
ATTORNEY

METHOD FOR PRODUCING PASSIVATED PN JUNCTIONS BY ION BEAM IMPLANTATION

BACKGROUND OF THE INVENTION

1. Field of the Invention

This invention relates generally to the fabrication of semiconductor devices, and, more particularly, to the formation of tucked-under, passivated junctions by ion implantation through a mask.

2. Description of the Prior Art

One of the generally desirable characteristics of the ion implantation method of introducing dopant impurities into a semiconductor surface is that the dopant impurities proceed in a substantially straight line path without the isotropic, sideways movement of impurities which is characteristic of a diffusion process. This straight line characteristic does create a problem, however, in that planar junctions produced by ion implantation are not normally tucked under a protective, passivating oxide where the junction intersects the surface of the device.

One way of solving this problem, as disclosed in U.S. Pat. No. 3,388,009, issued June 11, 1968, is to implant the dopant ions through a mask and then form a new protective coating over the surface so that the apertures in the new protective coating are smaller than the corresponding apertures in the mask. This method, of course, results in junctions which are tucked under the edges of the apertures in the new coating. However, this method is unsatisfactory for many applications in that it is difficult to align accurately the apertures in the new coating with the apertures in the original ion implantation mask. Alignment becomes increasingly difficult as device geometries decrease in size.

SUMMARY OF THE INVENTION

Accordingly, a primary object of the present invention is a method for fabricating tucked-under, passivated junctions by ion implantation without incurring the above-described alignment problem.

To this and other ends, the method in accordance with our invention includes the use of a layered mask against which a beam of high energy dopant ions is directed to produce the desired junction configuration.

More specifically, in accordance with a preferred embodiment of our invention there is formed a first relatively thin layer of a first material over the surface of a semiconductive body. A second coating of a different material, preferably conductive, is formed thereover. Then, using any of a variety of techniques well known in the art, an aperture is formed in the second layer so that a portion of the first layer is exposed. The structure is then subjected to a beam of dopant ions having energies sufficient to penetrate the exposed first layer and sufficient to alter the conductivity of the semiconductor thereunder, but of energy insufficient to penetrate completely the portions of the structure in which the second layer overlies the first. In this manner a localized zone is formed in the semiconductor body underneath the aperture in the second layer.

Then the conductive layer is caused to become thicker, e.g., by electroplating, so that the aperture in the second layer becomes smaller in lateral dimensions. Then, using the second layer for a mask, the portion of the first layer which is exposed through the aperture in the second layer is selectively removed, e.g., by backsputtering. This selective removal exposes a portion of the semiconductor surface which is smaller in lateral extent than the implanted localized zone and so the junction defining the zone is tucked under the edge of the void in the first layer.

Selective backsputtering is well known in the art and is taught, for example, in U.S. Pat. No. 3,271,286, issued Sept. 6, 1966 to M. P. Lepselter and assigned to the assignee hereof.

It will be apparent to those skilled in the art that selective chemical etching, rather than the above-described selective backsputtering, may be used to form the apertures in the layered mask, if desired.

Also, the above-described masking procedure may be repeated successively to form nested localized zones and/or spaced zones in a semiconductor body.

BRIEF DESCRIPTION OF THE DRAWING

The foregoing and other objects, features and advantages of the invention will be more clearly understood from the following detailed description taken in conjunction with the drawing in which.

It will be understood that for clarity and simplicity of explanation the figures of the drawings have not necessarily been drawn to scale.

DETAILED DESCRIPTION

Figure 1:
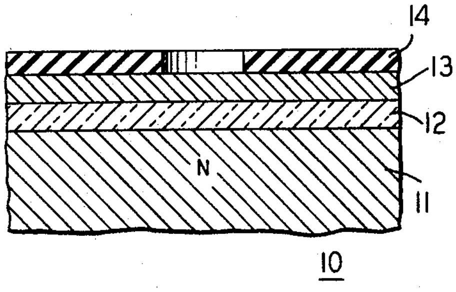
FIGS. 1–6 illustrate cross sections of a semiconductive body substantially as it appears following successive fabrication steps in accordance with a particular embodiment of our invention.
Figure 2:
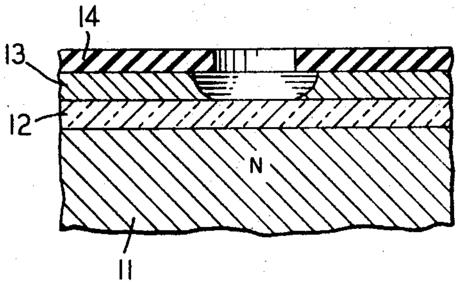

With reference now to the drawing, FIG. 1 shows a portion 10 of a semiconductive body 11, typically of silicon, having multiple coatings thereover. A first layer 12 is formed over and contiguous with the surface of the semiconductive body 11. Preferably, layer 12 is a relatively thin passivating dielectric, e.g., a thermally grown silicon oxide layer about 1000 A. or more in thickness. However, other dielectrics may be used, e.g., aluminum oxide, silicon nitride, or zirconium oxide; and, of course, a deposited layer of silicon oxide may be used instead of the thermally grown oxide.

Over layer 12 there is formed a second layer 13 of a different material, preferably conductive, e.g., gold, platinum, nickel, zirconium, or any of a variety of other conductors. In a particular example, layer 13 comprises approximately 1,000–10,000 A. of gold which may be formed by evaporation or sputtering or other techniques well known in the art.

Depending upon the particular application and upon the materials selected for layers 12 and 13, it may be desirable to provide one or more intermediate layers (not shown) therebetween, e.g., to improve the adherence of layer 13 to layer 12. For example, a thin layer (few hundred Angstroms) of chromium or nickel or a multiple layer of titanium and platinum advantageously is used as an intermediate layer between a layer 13 of gold and a layer 12 of a dielectric. However, this intermediate layer is not essential to our invention; and, for simplicity and clarity, is not shown in the drawing.

Proceeding, then, with the process, a photoresist layer 14 is formed over layer 13. Layer 14 includes at least one aperture, formed in the usual fashion, through which a portion of layer 13 is exposed. Then the structure is exposed to an ambient which selectively removes the exposed material of layer 13 but which does not attack the photoresist layer 14 appreciably. For example, potassium tri-iodide ($KI_3$) etches gold but does not substantially attack either silicon oxide or the commonly used organic photoresist materials. Alternatively, the structure of FIG. 1 may be subjected to backsputtering so that the material of layer 13 exposed through the aperture in layer 14 is removed. If an intermediate layer is used as described above, this layer also may be removed by selectively etching or backsputtering at this time.

Figure 3:
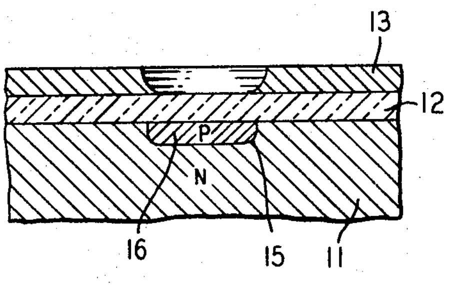

Then, as shown in FIG. 3, the layer 14 is removed and the structure is subjected to ion implantation. The energy of the dopant ion is advantageously adjusted to be sufficient to penetrate the uncovered portion of layer 12 and sufficient to alter the conductivity of the semiconductor thereunder but of energy insufficient to penetrate completely those portions of the structure in which layer 13 overlies layer 12. In this fashion a PN junction 15 is formed under the aperture in layer 13.

In the particular example using 1,000 A. of silicon oxide for layer 12 and 10,000 A. of gold for layer 13, a beam of boron ions of about 100,000 electron volts will form in body 11 a junction extending about 2,000 A. in from the surface.

Figure 4:
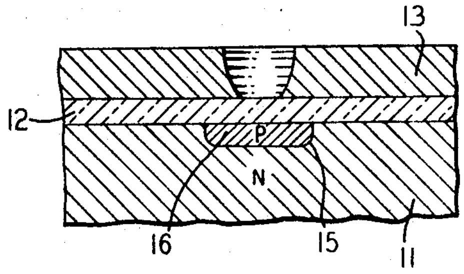

At this point, in accordance with our invention, an aperture is formed in layer 12 which is smaller in lateral extent than is the localized zone 16 defined by junction 15. More specifically, as shown in FIG. 4, layer 13 is caused to become thicker, for example, by electroplating, so that the aperture in layer 13 becomes smaller in lateral extent. In this particular embodiment in which gold is used as layer 13, additional gold may be electroplated in an acid citrate solution in accordance with techniques well known in the art to any desired thickness.

Other techniques may also be used for causing layer 13 to become thicker. For example, one may use for layer 13 a material selected from among these which expand upon oxidation and which form an oxide of high-quality insulting characteristics as disclosed in the copending U.S. application, Ser. No. 760,161, filed Sept. 17, 1968 in the name of M. P. Lepselter and assigned to the assignee hereof.

Having caused the aperture in layer 13 to become smaller the portion of layer 12 exposed through the aperture in layer 13 is selectively removed, e.g., by chemical etching in hydrofluoric acid or by backsputtering. Backsputtering advantageously is used for this selective removal because, depending upon particular techniques used, the electroplated portion of layer 13 may not adhere to layer 12 around the aperture in layer 13 well enough to withstand chemical etching satisfactorily. In this fashion, as shown in FIG. 5, there is formed in layer 12 an aperture which is smaller in lateral extent than the localized zone 16 and a portion of the surface of zone 16 thereby is exposed.

Having formed the aperture in layer 12, layer 13 may be removed or retained, as desired, for the particular application. If layer 13 is conductive, however, it will normally be removed to avoid interelectrode electrical shorting.

Figure 5:
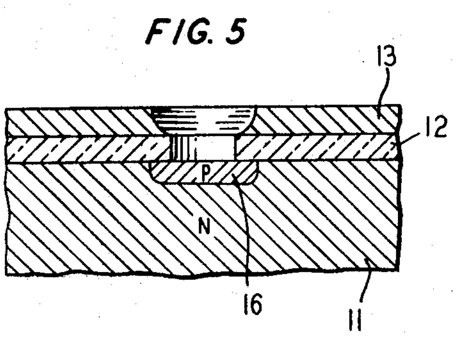
Figure 6:
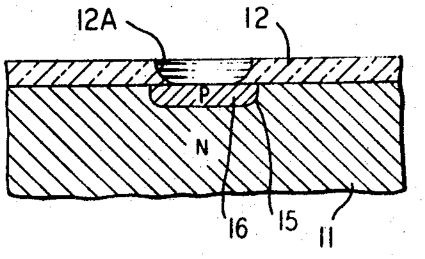

FIG. 6 shows the structure of FIG. 5 with layer 13 removed. As shown, PN junction 15 between P-type zone 16 and substrate 11 is tucked under the edge 12A of the passivating dielectric layer 12.

It will be understood that other arrangements may be devised by those skilled in the art without departing from the spirit and scope of our invention.

For example, none of the masking layers need be dielectrics. Any or all of those layers may be conductive, as selected by the worker in the art for particular situations.

Further, the above-described process may be repeated successively to form spaced or nested PN junctions, e.g., to form a transistor.

Still further, although these examples have been described in terms of a single localized zone, it is obvious that many such zones and nested zones may be formed in a single semiconductor body, e.g., in integrated circuit configurations.

What is claimed is:

1. A method of forming by ion implantation a localized zone in a semiconductive body comprising the steps of:

forming a substantially uniform first coating on a surface of the body;

forming a substantially uniform second coating over the first coating;

forming an aperture in the second coating over that portion of the body in which the localized zone is to be formed;

subjecting the structure to a beam of dopant ions having energy sufficient to penetrate the first coating and to alter the semiconductivity of the body under the aperture in the second coating and form a PN junction but insufficient to penetrate completely the combined first and second coatings;

causing the second coating to become thicker and the aperture in the second coating to become smaller such that the second coating now overlies the intersection of the PN junction with the surface of the body; and removing the portion of the first coating exposed by the remaining smaller aperture in the second coating.

2. A method as recited in claim 1 wherein:

the first coating is nonconductive and the second coating is conductive.

3. A method as recited in claim 2 wherein:

the conductive coating is caused to become thicker by electroplating.

4. A method as recited in claim 1 wherein:

the first coating comprises a material selected from the group consisting of silicon oxide, silicon nitride and aluminum oxide; and the second coating comprises a material selected from the group consisting of gold, platinum, nickel and zirconium.

5. A method of forming by ion implantation a localized zone in a semiconductive body comprising the steps of:

forming a substantially uniform nonconductive coating on a surface of the body;

forming a substantially uniform conductive coating over and contiguous with the nonconductive coating;

forming an aperture in the conductive coating over that portion of the body in which the localized zone is to be formed;

subjecting the structure to a beam of dopant ions having energy sufficient to penetrate the nonconductive coating and sufficient to alter the semiconductivity of the body under the aperture in the conductive coating but insufficient to penetrate completely the combined conductive coating and nonconductive coatings;

electroplating the conductive coating so that the conductive coating becomes thicker and the aperture in the conductive coating becomes smaller; and removing the portion of the nonconductive layer exposed by the remaining smaller aperture in the conductive layer.

6. A method as recited in claim 5 wherein:

the nonconductive coating is selected from the group consisting of silicon oxide, silicon nitride and aluminum oxide; and the conductive coating is selected from the group consisting of gold, platinum, nickel and zirconium.

7. A method as recited in claim 5 wherein backsputtering is used to remove the portion of the nonconductive layer exposed by the remaining smaller aperture in the conductive layer.